United States Patent [19]

Craig et al.

[11] Patent Number: 5,597,457
[45] Date of Patent: Jan. 28, 1997

[54] SYSTEM AND METHOD FOR FORMING SYNTHETIC PROTEIN CRYSTALS TO DETERMINE THE CONFORMATIONAL STRUCTURE BY CRYSTALLOGRAPHY

[75] Inventors: George D. Craig, Lafayette; Robert Glass, Livermore; Bernhard Rupp, Dublin, all of Calif.

[73] Assignee: The Regents of the University of California, Oakland, Calif.

[21] Appl. No.: 630,711

[22] Filed: Apr. 8, 1996

Related U.S. Application Data

[63] Continuation-in-part of Ser. No. 376,612, Jan. 23, 1995, Pat. No. 5,525,198.
[51] Int. Cl.$^6$ ............... C10M 171/00; C10M 169/04
[52] U.S. Cl. ............... 204/165; 205/688; 378/73; 378/78; 435/173.1; 435/173.2; 435/173.3
[58] Field of Search ............... 204/164, 165; 205/688; 378/73, 78; 435/173.1, 173.2, 173.3

[56] References Cited

U.S. PATENT DOCUMENTS

| | | | |
|---|---|---|---|
| 5,342,692 | 8/1994 | Ribi | 428/420 |
| 5,525,198 | 6/1996 | Craig et al. | 204/164 |

OTHER PUBLICATIONS

C. G. Worley, R. W. Linton, and E. T. Samulski, "Electric-Field-Enhanced Self-Assembly of α-Helical Polypeptides", Langmuir, vol. 11 No. 10, pp. 3805–3810, 1995.

"Search for Better Crystals Explores Inner, Outer Space", Science, vol. 270, pp. 1921–1922, Dec. 1995.

A. M. Edwards, S. A. Darst, S. A. Hemming, Y. Li, and R. D. Kornberg, "Epitaxial growth of protein crystals on lipid layers", Structural Biology, vol. 1, No. 3, pp. 195–197, Mar. 1994.

M. F. Toney, J. N. Howard, J. Richer, G. L. Borges, J. G. Gordon, O. R. Melroy, D. G. Wiesler, D. Yee, and L. B. Sorensen, "Voltage–dependent ordering of water molecules at a electrode–electrolyte interface", Nature, vol. 368, pp. 444–446, Mar. 1994.

C. Okazaki and K. Takeda, "Electrically–Induced Memory Effect in Bacteriorhodopsin", Jpn. J. Appl. Phys. vol. 34, Part 1, No. 4A, pp. 1963–1967, (1995).

Primary Examiner—Arun S. Phasge
Attorney, Agent, or Firm—Henry P. Sartorio; Richard B. Main

[57] ABSTRACT

A method for forming synthetic crystals of proteins in a carrier fluid by use of the dipole moments of protein macromolecules that self-align in the Helmholtz layer adjacent to an electrode. The voltage gradients of such layers easily exceed $10^6$ V/m. The synthetic protein crystals are subjected to x-ray crystallography to determine the conformational structure of the protein involved.

10 Claims, 2 Drawing Sheets

SYSTEM AND METHOD FOR FORMING SYNTHETIC PROTEIN CRYSTALS TO DETERMINE THE CONFORMATIONAL STRUCTURE BY CRYSTALLOGRAPHY

The United States Government has rights in this invention pursuant to Contract No. W-7405-ENG-48 between the United States Department of Energy and the University of California for the operation of Lawrence Livermore National Laboratory.

APPLICATION

This is a continuation-in-part (CIP) of U.S. patent application Ser. No. 08/376,612, titled ELECTRORHEOLOGICAL CRYSTALLIZATION OF PROTEINS AND OTHER MOLECULES, filed Jan. 23, 1995, now U.S. Pat. No. 5,525,198. Such application is incorporated herein by reference.

BACKGROUND OF THE INVENTION

1. Field of the Invention

The present invention relates to protein study and more particularly to methods and devices for crystallizing proteins suitable for x-ray diffraction studies.

2. Description of Related Art

The conformational structure of proteins is a key to understanding their biological functions and to ultimately designing new drug therapies. The conformational structures of proteins are conventionally determined by x-ray diffraction from their crystals. Unfortunately, growing protein crystals of sufficient high quality is very difficult in most cases, and such difficulty is the main limiting factor in the scientific determination and identification of the structures of protein samples. Prior art methods for growing protein crystals from super-saturated solutions are tedious and time-consuming, and less than two percent of the over 100,000 different proteins have been grown as crystals suitable for x-ray diffraction studies.

Missing protein structural information is a significant obstacle to the rational design of drugs and vaccines for diseases such as AIDS. Of the proteins encoded by the AIDS genome, only one, namely HIV protease, has a known three-dimensional structure. The remaining proteins, in particular the HIV reverse transcriptase molecule which is essential for retroviral replication, have so far proven resistant to x-ray crystallography, which is, at present, the most widely-used technique for determining protein structures.

As another example, cystic fibrosis is an inherited disorder associated with a defective gene which codes for the protein known as cystic fibrosis transmembrane conductance regulator (CFTR). Approximately one person in thirty carries a defective gene for CFTR. If both spouses carry the gene, then one in fur of their children will be at severe risk for early death from pulmonary insufficiency and/or infection. Like the overwhelming majority of transmembrane proteins, CFTR is resistant to crystallization, and thus its structure cannot be determined by x-ray crystallography.

The problem in the prior art has been to determine the molecular structure of proteins to near atomic resolution, e.g., under two Angstroms. Many biologists require such resolution so that they can determine protein function. Such resolution indicates the use of x-rays, rather than electrons, to illuminate the proteins. Drug designers and protein engineers use the same conformational information to design adducts to dock with the protein and/or modify its function.

Protein structures of atomic resolution are catalogued by Brookhaven National Laboratory and made available to the public via the Internet, e.g., at "http://www.pdb.bnl.gov/". The Protein Data Bank (PDB) is an archival computer database of three-dimensional structures of biological macromolecules. The database contains atomic coordinates, bibliographic citations, primary sequence and secondary structure information, as well as crystallographic structure factors and 2D-NMR experimental data. Information is available on protein, DNA, RNA, virus and carbohydrate structures. The database is updated approximately every three weeks and a newsletter and CD-ROM are published quarterly. The data is normally distributed using the PDB interchange format which has become the standard for the field. The PDB is supported by a combination of Federal Government Agency funds and user fees. Support is provided by the U.S. National Science Foundation, the U.S. Public Health Service, National Institutes of Health, National Center for Research Resources, National Institutes of General Medical Sciences, and National Library of Medicine and the U.S. Department of Energy under contract DE-AC02-76Ch00016.

Brookhaven reports that progress in their endeavor of cataloguing 100,000 human proteins has been arduous. As of Jan. 17, 1996, there were 4,070 coordinate entries, 3,785 proteins, 273 nucleic acids, and 12 carbohydrates posted in the data bank.

One of the main reasons for this slow progress is the "protein crystallization bottleneck". Because proteins are small, they cannot be x-ray imaged individually. Instead, the many identical scattering centers found in a protein crystal are used. Then a reconstruction of their three-dimensional structure can be attempted by Fourier synthesis from an x-ray (or electron) diffraction pattern. The bottleneck in this process is in the tedious empirical lab work that growing protein crystals requires. Some protein crystals can take months to grow, some even take years. Many protein crystals prove to be completely elusive, or are of insufficient quality, no matter how patient a lab is in its experiments.

The application of electric fields to colloids has been used to change the optical properties of liquid crystals in a digital display. In electrophoresis, the electric field has been used to sort biomolecules. In complex fluids, a mixture of micron-sized particles in oil solidifies when exposed to an electric field, e.g., electrorheology which deals with the viscosity of fluids. Colloidal particles are observed to arrange themselves into a body-centered tetragonal lattice under the influence of the applied electric field. This lattice-on-demand effect can help protein crystallographers to produce diffraction quality crystals. The idea of aligning α-helical polypeptides in an electric field and letting them self-assemble into a two-dimensional crystal has already been demonstrated. See, Worley, et al., "Electric-Field-Enhanced Self-Assembly of α-Helixical Polypeptides", Langmuir, 11 (95) 3805.

Electrocrystallization of inorganics at an electrode is a well-known technique. However its application to proteins is not, albeit related to studies of protein electrode position and adsorption on electrode surfaces. But in electrorheology, insulation barriers are strategically placed so redox reactions and electrode currents are prevented, and thus such reactions and currents can be neglected.

Aled M. Edwards, et al., report in, "Epitaxial growth of protein crystals on lipid layers", *Structural Biology*, volume 1, number 3, March 1994, pp. 195–197, the growth of three-dimensional protein crystals seeded by two-dimensional crystals formed on lipid layers. Epitaxial growth was accomplished using glass coverslips coated with lipid layers of preformed 2-D crystals or with lipid layers alone, e.g., in a hanging drop.

Michael F. Toney, et al., describe in, "Voltage-dependent ordering of water molecules at an electrode-electrolyte interface", *Nature*, vol. 368, no. 31, March 1994, pp. 444, in situ x-ray scattering to investigate water distribution perpendicular to an aqueous-metal interface.

Other research indicates that crystal-like, ordered arrays of glass microspheres can be formed in seconds when subjected to a strong external electric field. Similar electric fields are available in electrochemical cells near the electrode interface.

In electrorheology, electric fields of $10^6$ V/m are used to migrate 20 μm colloid particles from an isotropic fluid distribution to a body-centered tetragonal lattice of particles. In the liquid crystal art, comparable electric fields are used to switch smaller rod-like, or disk-like, particles from an isotropic distribution to a partially ordered nematic state. In electrochemistry, vicinal ice is known to form at the electrode-water interface where the field strength within the electric double layer can reach $10^9$ V/m. The physical mechanism in each of these cases is similar. It involves the rotational orientation of permanent and/or induced electric dipoles of particles by an applied electric field.

A field strength of $10^8$ V/m exceeds the bulk dielectric breakdown strength of water by two orders of magnitude. However, it is well known from fundamental studies of the electrochemical double layer that field strengths of this magnitude routinely exist near an electrode's surface. In other words, the voltage gradient between pairs of electrodes is not linear with distance. Most of the field is dropped within a few tens of Angstroms of the electrode surface. In the bulk, there is only a small electric field associated with the resistance of the solution. The bulk of an electrolyte merely feeds proteins to the double layer and promotes synthetic crystal growth.

SUMMARY OF THE INVENTION

An object of the present invention is to provide a method and device for growing diffraction-quality protein crystals.

Briefly, a method embodiment of the present invention comprises forming synthetic crystals of proteins in a carrier fluid by use of the dipole moments of protein nanoparticles that self-align in the Helmholtz layer adjacent to an electrode. The voltage gradients of such layers easily exceed $10^6$ V/m. The synthetic protein crystals are subjected to x-ray crystallography to determine the conformational structure of the protein involved.

An advantage of the present invention is that an electrocrystallization method of making protein crystals is provided that is more rapid than prior art methods.

Another advantage of the present invention is that an electrocrystallization method of making protein crystals is provided that can be applied to a range of proteins that far exceeds that of conventional methods.

DETAILED DESCRIPTION OF THE INVENTION

Figure 1:
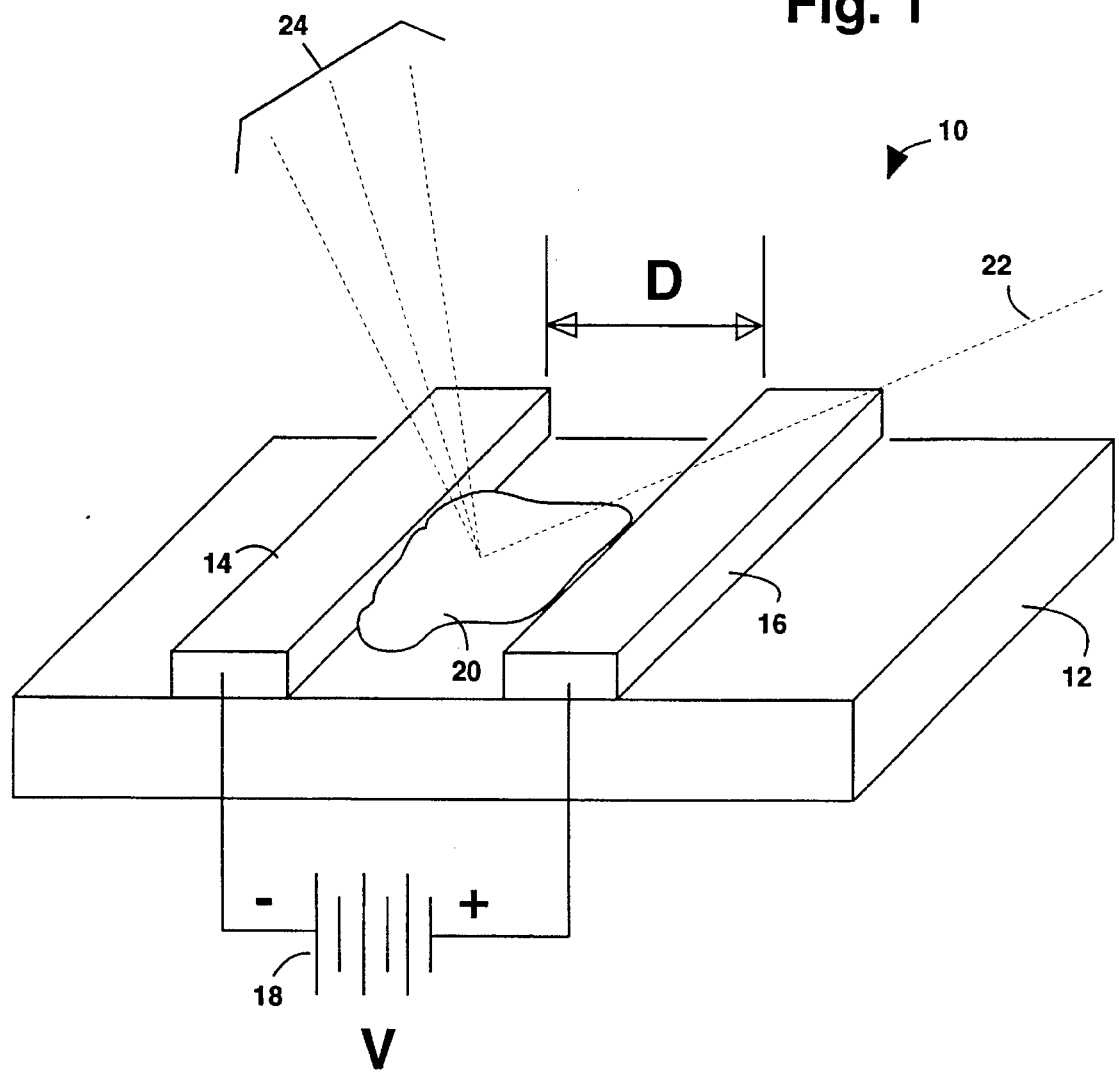
FIG. 1 is a diagram of a system embodiment of the present invention for determining the conformational structure of proteins by x-ray crystallography.

FIG. 1 illustrates a system of the present invention for determining the conformational structure of proteins by x-ray crystallography and referred to herein by the general reference numeral 10. The system 10 comprises a substrate 12, e.g., of glass, carbon, or silicon, and a pair of electrodes 14 and 16. The electrodes are preferably parallel to one another and disposed within a solvent containing protein solution 20. Notwithstanding the illustration of the protein solution 20 as a mass in FIG. 1, it is preferred that the electrodes 14 and 16 provide a broad and uniform contact with the fluid carrier 20. Hydrophilic protein macromolecules are preferably mixed into a carrier fluid of liquid water to constitute the protein solution 20. A surfactant may be added to improve wetting and to coat hydrophobic protein macromolecules In particular embodiments, the electrodes 14 and 16 are separated by an arbitrary distance "D", e.g., one micrometer. A direct current voltage source 18 is connected across the electrodes 14 and 16 and produces a voltage "V". This produces an electric field gradient across a protein solution 20 disposed between the electrodes 14 and 16. For aqueous protein solutions 20, the electric fields are largest near each electrode, e.g., the "Helmholtz layer". The voltage V from the source 18 applied to the electrodes 14 and 16 is preferably in the range of 1–10 volts for aqueous protein solutions. For non-aqueous protein solutions, higher voltages and separation distances, such as 100 microns or more, are used consistent with voltage breakdown considerations. The protein solution preferably comprises a liquid and protein macromolecule mixture wherein the protein macromolecules are no smaller than one nanometer and no larger than one micrometer.

An x-ray or electron beam 22 is directed at the protein solution 20 after sufficient time has transpired with the voltage V applied to promote the crystal-like agglomeration of two-dimensional protein pearl chains and three-dimensional synthetic protein crystals, e.g., in the Helmholtz layers adjacent to the electrodes 14 and 16 where the voltage gradient is sufficiently great. Without the electric field, the synthetic protein crystals may not cohere and begin to dissolve. The beam 22 may have to be scanned to find whatever synthetic protein crystals may have nucleate on the electrodes 14 and 16, e.g., because certain proteins will promote only very small synthetic crystal formations. The conformation of the protein constituents of such synthetic protein crystals produces a characteristic scattering of the incident beam 22 into a scatter 24. Conventional x-ray and electron crystallography methods and devices are used to detect and interpret the scatter 24 into useful information regarding the conformational structure of the synthetic protein crystals.

The three-dimensional structure of proteins can be determined in a number of ways. Perhaps the best known way of determining protein structure is x-ray crystallography. See *Physical Bio-chemistry*, Van Holde, K. E. (Prentice-Hall, New Jersey 1971), pp. 221–239, and *Physical Chemistry with Applications to the Life Sciences*, D. Eisenberg & D. C. Crothers (Benjamin Cummings, Menlo Park 1979). With x-ray crystallography it is possible to elucidate three-dimensional structure with good precision. Protein structures can also be determined by neutron diffraction and nuclear magnetic resonance (NMR). See, e.g., *Physical Chemistry*, 4th Ed. Moore, W. J. (Prentice-Hall, New Jersey 1972), and *NMR of Proteins and Nucleic Acids*, K. Wuthrich (Wiley-Interscience, New York 1986). The three-dimensional structure of many proteins may be characterized as having internal surfaces directed away from the aqueous environment in which the protein is normally found and external surfaces which are exposed to the aqueous environment.

In alternative embodiments, the electrodes 14 and 16 may be comprised of gold, platinum or aluminum to be compatible with ordinary semiconductor processes. Whatever materials are used should preferably promote wetting or beading by the protein solution 20. The liquid chosen to suspend the protein macromolecules in the protein solution 20 can also be manipulated to accommodate wetting or beading. To prevent an electric current that could damage the protein crystals from flowing through the electrodes, the electrodes 14 and 16 may be coated by a thin dielectric, e.g., silicon dioxide, or subjected to a strong orthogonal magnetic field that turns around any electron from an electrode back to where it came from. Where being able to see into the protein solution 20 from the outside is important, the substrate 12 can be glass and the electrodes 14 and 16 formed from indium-tin-oxide (ITO). A micro-fabricated channel and micro-pump are preferred devices for the delivery of the protein solution 20 to its site bridging the two electrodes 14 and 16.

In summary, the electrocrystallization of proteins is a more rapid method for growing high quality protein crystals. An electric field of a double layer of an electrode-solution interface is used to align protein molecules in liquid suspension into a two-dimensional seed lattice for subsequent self-assembly of three-dimensional protein crystals. The electric field strengths needed to align large protein molecules in solution are readily attained. The rotational orientation of permanent and induced electric dipoles results in a scaling relationship between the electric field strength and the molecular size needed to erect a lattice of polarized molecules. The voltage-dependent reorientation of water molecules at an electrode-solution interface and the reorientation of much larger colloid particles in an electric field has already been reported. Electric field strengths of approximately $10^8$ V/m can be used to align protein molecules as large as 100 Angstroms. Such electric field strengths are preferably obtained in the double layer of an electrode-solution interface.

There are a number of experimental variables which can affect protein crystallization, e.g., solvent, concentration of proteins, presence and concentration of other solution components (ions and neutral species), electrode material, cell geometry, potential, temperature, etc.

In general, proteins should orient themselves at the electrode surfaces in the presence of strong electric fields generated in a compact layer, e.g., $10^8$ V/m., due to dipole orientation. However, there can be chemical interactions between the electrode surface and the protein that impact the orientation and therefore the whole synthesis of a quality crystal. For example, sulfur-containing molecules, such as thiols, often show strong adsorption on a gold electrode, and self-assembly of monolayers has been observed based upon this interaction. Such interactions may exceed the field-induced forces that act on the molecular dipoles.

Apolipoproteins are composed of amino acid groups, as are all proteins, and some contain sulfur atoms. However, the functional groups responsible for strong interactions must be available to the electrode. If the relevant groups are on the "outside" of the molecule, they can interact with the electrode. If the functional groups are "hidden" within the protein structure, the alignment depends on dipole interactions. The proteins will compete for positions on the electrode with other solution components. The adsorption on a electrode can be controlled with the applied potential. Neutral species, such as proteins, are most strongly adsorbed at zero charge potential.

The experimental parameters accessible in electrochemical experiments can be used to tune the system for maximum adsorption of proteins. Given that the proteins can be persuaded to preferentially orient at an electrode surface, it is expected that two-dimensional and three-dimensional growth will result. The electric field at the electrode-solution interface is useful for initiation of crystallization, but additional growth may be promoted through largely chemical interactions at immobilized proteins.

The present invention includes electric-field-assisted protein crystallography, where an applied electric field is used to create synthetic protein crystals on demand. The crystals exist at room temperature as long as there is an applied voltage. They may be cryofrozen, have the applied voltage removed and then cryostored. They are screened by conventional x-ray crystallographic techniques to determine the conformational structure of the protein.

Here, the dielectric-mismatch model of electrorheology is applied to proteins in order to estimate the field strengths that are required to crystallize them. The crystal may be synthetic and exist only while the field is on or it may facilitate crystallization in the conventional sense. Crystallization is induced by aligning the permanent and/or induced dipole moment of the protein with a strong electric field.

The particle sizes of interest are roughly between one nanometer (10 Å) and one micrometer (10,000 Å). Representative globular proteins are about ten nanometers in size. The electric field strengths range between 3 MV/m and 3 GV/m, which respectively represent the air breakdown and the ionization potential of the hydrogen atom.

In general, the potential energy of a charge distribution in an electric field is given by the multipole expansion, $$W = q\Phi - \bar{\mu} \cdot \bar{E} - \frac{1}{6} \bar{E} \cdot \bar{\bar{Q}} \cdot \bar{E} + \ldots, \quad (1)$$

where $q$, $\bar{\mu}$, and $\bar{\bar{Q}}$ are the (scalar) charge, (vector) dipole moment and (tensor) quadrupole moment of the charge distribution, and $\Phi$ and $\bar{E}$ are the local potential and electric field. In calculating $W$, a dielectric model is simply used to describe the detailed electrochemistry of the solute and solvent. The charge distribution of interest is taken as an electrically neutral ($q=0$) solvated protein. This is consistent with the fact that the bonds in a protein crystal are the weaker van der Waals and hydrogen bonds as opposed to the stronger ionic bond. The solvated protein is assumed to be in its natural biological conformation in the carrier fluid and is simply referred to as "the protein" herein elsewhere.

The lowest order for the interaction energy of a protein with a uniform electric field E, is given by, $$W = -\bar{\mu} \cdot \bar{E}, \quad (2)$$

where the dipole moment of a protein is the vector sum, $\bar{\mu} = \bar{\mu}_0 + \bar{\mu}_i(E_a)$, of its permanent dipole moment and the dipole moment induced in it. The local electric field is the vector sum, $\bar{E}=\bar{E}_a+\bar{E}_i(E_a)$, of the applied electric field and the induced polarization field.

The permanent dipole moment of a protein can be measured experimentally or approximated by an ab-initio quantum mechanical calculation. It can be written as $\bar{\mu}=q\bar{d}$, which is the product of a charge and a separation distance. For example, the dipole moment of a charge $e^+$ and a charge $e^-$ at opposite poles of a sphere of one Angstrom diameter is 4.8 D (Debye). In actuality, the permanent dipole moment of a small molecule is only about one Debye, according to J. Israelachvili, *Intermolecular & Surface Forces*, Academic Press, 1992. The amount of charge involved is less than e, and the separation distance can be smaller than the diameter of the molecule. The permanent dipole moment $\mu_0$ for large macromoleculars has been reported in the literature, e.g., $\mu_0$=400 D for oxyhaemoglobin, $\mu_0$=300 D for horse cytochrome c, and $\mu_0$=3.5·n D for an $\alpha$-helix structure of a polypeptide of n residues.

The induced dipole contribution $\mu_i(E_a)$ can be estimated from a simple dielectric model for the protein. A dielectric sphere modifies a uniform electric field by forming a polarization surface charge. This surface charge on the sphere is created by shifting the electron cloud infinitesimally from the protons embedded in it. The new charge distribution satisfies the boundary condition for the electric field across the interface of the sphere. To estimate the effect, globular proteins are selected which can be characterized by a dielectric constant $\epsilon_p$. The induced dipole moment of a spherical globular protein is then given by the well-known result, $$\mu_i = 4\pi\epsilon_0\epsilon_f \left( \frac{\epsilon_p - \epsilon_f}{\epsilon_p + 2\epsilon_f} \right) r_p^3 E_a, \quad (3)$$

where $r_p$ is radius of the protein, $\epsilon_f$ is the dielectric constant of the fluid and $\epsilon_0$=8.85×10$^{-12}$ F/m is the permittivity of free space.

It is critical that there be a "dielectric mismatch" between the dielectric constant of the protein and the carrier fluid in which it's suspended, in order to permit the induction of a dipole moment. Further, the dipole moment $\mu_i$ that is induced scales with the volume of the particle, $r_p^3$. According to equation (3), the induced dipole moment of a particle can be relatively large. Assuming $r_p$=0.1 µm, $\epsilon_p$=10, $\epsilon_f$=2 and, $E_a$=1.0 MV/m, then $\mu_i$=800 Debyes.

The permanent dipole moment and induced dipole moments of different proteins can both be hundreds of Debyes at easily attainable field strengths. Equation (3) implies that $E_a$ can be ramped up to increase the dipole orientation energy of the protein over its randomizing Brownian motion. Neglecting the Brownian motion of the carrier fluid, the electric field acts to orient and align the proteins such that its net dipole moment $\bar{\mu}=\bar{\mu}_0+\bar{\mu}_i$ is parallel to the electric field.

In electrorheology, when more particles are added to a fluid, "pearl chains" form and are followed by the aggregation of the pearl chains into thicker strands, e.g., due to the dipole-dipole interaction of the polarized particles. A simple picture is that each particle has an excess positive charge on top and an excess negative charge on the bottom that is induced by the electric field. These form vertically oriented electric dipoles (+–) in the carrier fluid. Pearl chains form when the oriented dipoles stack on top of each other (+–)(+–)(+–)(+–) to create an alternating sequence of charges, e.g., to minimize the Coulomb energy. When the pearl chains float near to each other, they can further minimize their Coulomb energies by interstitially registering between themselves. A volume element $\Delta V$ taken from a thick strand of chains can then be viewed as a lattice of uniformly spaced alternating (+) and (–) charges. Such has been demonstrated in the prior art for glass microspheres in oil at $E_a$=1 MV/m. Vertical strands have been shown to condense out of the carrier fluid into solid, body-centered tetragonal microlattices of colloidal particles.

With proteins, the usual three spatial degrees of freedom in protein crystallization are reduced to one azimuthal degree of freedom, due to the electric field. Hydrogen bonds and van der Waals forces are assumed to form between pairs of proteins in the lattice, e.g., as they do in conventional crystallization process. Such produces a lattice of identically oriented proteins, or a synthetic protein crystal.

As polarized proteins try to assemble into a lattice, they must compete against the random Brownian motion of the carrier fluid. The dipole-dipole interaction energy W must dominate over the thermal energy kT, e.g., to insure that the dipole bonds of the lattice are resolute.

The Gast number, $\lambda$=W/kT, is defined as the ratio of the strength of the dipole-dipole bond to the thermal energy in an experiment. In electrorheology, one typically deals with $\lambda=\lambda_0 \approx 10^4$–$10^6$. But this is excessively high for crystallographic applications, because the lattice is not being fortified against shear forces. The value of $\lambda=\lambda_0$ for which a carrier fluid-to-solid phase transition first occurs is what is important and has been reported to occur as low as $\lambda_0 \approx 3$.

Taking $\lambda_0$ as a given, the equation $\lambda_0$=W/kT is solved for the required electric field $E_a$. For the interaction energy W of two identical dielectric spheres of radius $r_p$ in the (+–) pearl chain configuration, $$W = -\bar{\mu}_1 \cdot \bar{E}(\mu_2) = -\frac{1}{16\pi\epsilon_0\epsilon_f} \frac{\mu^2}{r_p^3}, \quad (4)$$

where $\bar{\mu}_1=\bar{\mu}_2=\bar{\mu}=\bar{\mu}_0+\bar{\mu}_i(E_a)$ is the net dipole moment of each sphere, assuming, $\mu_0 \ll \mu_i$. Then the minimum field required to produce a resolute dipole assembly is, $$E_a = \sqrt{\frac{\lambda_0 kT}{\pi\epsilon_0\epsilon_r r_p^3}}, \quad (5)$$

where $\epsilon_r$ is a dielectric constant, in this case a simple function of $\epsilon_p$ and $\epsilon_f$. An ideal dielectric fluid for a given particle would have $\epsilon_f=\epsilon_p/5$, which implies $\epsilon_r=\epsilon_p/15$ in equation (5). This explains the well-known preference for using glass microspheres ($\epsilon_p \approx 10$) in oil ($\epsilon_f \approx 2$) to erect a dipolar lattice. Equation (5) represents the low field limit of a more complicated equation. The dielectric constant is a strong function of the field at high field strengths. In fact, for water $\epsilon_f \rightarrow 20$, as $E_a \rightarrow 1$ GV/m.

The field can be scaled for the size of the particles. In a typical $\lambda_0 \approx 10^4$ electrorheological experiment, the electric field scales, $$E_a = \sqrt{\frac{10^{-6}}{r_p^3}}. \quad (6)$$

Using such implied $\sqrt{\mu_0}$ scaling, the field strength can be estimated that is required to align large proteins, viruses or macromolecular assemblies. For $\lambda_0 \approx 10$, $r_p$=0.1 µm, $\epsilon_p \approx 10$, and room temperature, $E_a$=1.0 MV/m. This agrees with the available experimental evidence for pulsed birefringence in protein solutions and dichroism in a colloidal solution of 0.15 µm particles at $E_a$=1.0 MV/m.

There are certain limitations in using equation (6) to estimate the electric field strengths needed to erect a lattice of dipolar proteins. The value $\lambda_0$ must be for the appropriate lattice rigidity. The particles used, e.g. microspheres, corn starch, etc., may have irregular shapes and sizes and interact with the solvent principally via van der Waals type forces. In contrast, purified protein particles are uniform, denaturable, and their net charge depends on the pH of the solvent. Purified proteins can also interact with themselves and the solvent via chemical bonds. For proteins in aqueous solutions, when the optimal ratio, $\epsilon_p/\epsilon_f \approx 5$, cannot be engineered, the researcher must be able to work with what nature provides.

Electrocrystals of vicinal ice can be fabricated with the application of an external electric field. It has been demonstrated that the application of 1 GV/m across an electrode-water interface can create a multilayered resolute lattice of oriented water molecules on the electrode surface.

Vicinal ice data at the nanometer end of a particle size scale and electrorheological data at the micron end of particle size scale can be used to fit an empirical equation of the form $E_a \sim r_p^{-x}$, as suggested by equation (5). Assuming $r_p = 0.1$ nanometers for the radius of the water molecule, and $\lambda_0 = 10$ for the 1 μm glass sphere as described above, $$E_a = \sqrt{\frac{10^{-7}}{r_p^{2.5}}}, \quad (7)$$

Equations (6) and (7) suggest an upper and lower bound on the applied electric field which is required to erect a dipolar lattice of ten nanometer diameter globular proteins, and imply, $$3 \text{ MV/m} < E_a < 1 \text{ GV/m}. \quad (8)$$

In comparison, the field strength at the tip of a scanning tunneling microscope is about 10 GV/m. A field of 3 GV/m will ionize a hydrogen atom. Fields on the order of 1 GV/m can be applied across thin film interfaces. Plastics and bulk quantities of oil, water, and air break down between $10^6$ and $10^8$ V/m. The typical field strength used in electrorheological and liquid crystal research is $E_a < 3$ MV/m, because near this limit electric breakdown and flashover can damage bulk samples and air insulated electrode configurations. The stresses involved in gel electrophoresis are about $10^2$ V/m.

The orienting of proteins in pulsed electric fields in birefringence experiments is conventional. The data on vicinal ice strong supports the possibility of creating a dipolar lattice using macromolecules. The main issue is whether the proteins at each lattice site are in their native state or are denatured.

Proteins are, in reality, folded linear polymers of amino acids, not the simple spheres assuming in the preceding equations. Neighboring amino acids in a protein chain are held together by peptide bonds characterized by a fractional charge of 0.5 |e| and a spacing 0.1 nanometers. This corresponds to an electric field strength of almost 10 GV/m and is at least an order of magnitude larger than the fields applied herein to the proteins.

The forces which fold the chain of amino acids back on and around themselves are electrostatic, notwithstanding being called disulphide bonds, hydrogen bonds, van der Waals forces, solvent forces, etc. In general, such forces are weaker than the peptide bond, but they often act in concert. Recently, electric fields on the order of 3 GV/m have been measured at the end of an a helix and in the myoglobin heme pocket. Some subtle conformational changes have been measured in bacteriorhodopsin in a applied field of 100 MV/m.

The whole range of proteins can be divided into first through third morphologies, according to their mechanical strength. The first category of proteins have effective bond strengths that all exceed the applied field strengths. The second category of proteins consist of those whose primary, secondary, tertiary and higher order structures may get rearranged into a new configuration by an applied field. But this may still yield some useful crystallographic information about individual moieties. The third category of proteins are not candidates for inspection by methods of the present invention, because they are too delicate and can be denatured by an applied electric field. The number of proteins in each set is unknown at this time, but the total number of natural proteins is about 100,000. Standard molecular dynamic simulation codes could be used to turn off the applied electric field to quantify the electromechanical stress which might distort the globular protein from its native configuration.

The present invention includes exposing a sample to a uniform electric field, e.g., between two capacitor plates, or electrodes. The electric field between the plates is represented by $E_a = V_a/\epsilon_r d$, where $\epsilon_r d$, is the dielectric constant of the sample and d is the distance between the plates. If the sample is dry air ($\epsilon_r = 1$), then a 1 MV/m field can be setup over a 3 cm wide volume with a 30 kV power supply. If the sample is made up of polar molecules (deionized water, $\epsilon_r = 78$) or non-polar ones (oil, $\epsilon_r = 2$), the 1 MV/m value is reduced by the effective dielectric constant. Once the field strength in the sample reaches ~3 MV/m, electrons are theorized here to break lose from fluctuations in the fluid, or on the electrode surface, and then cascade from one electrode to the other by arc flashing around the sample or punching through it. This is why most electrorheological fluids and liquid crystals are not exposed to field strengths above 3 MV/m. Such limits the use of higher voltages over macroscopic volumes.

Pressurization or alternative carrier fluids can be used to push a little beyond the 3 MV/m limit, but the conductivity of the aqueous protein solution still presents a problem. Most proteins occur in their native configuration only in physiologic or aqueous fluids with a pH ~8. The deep penetration of a static DC electric field into an aqueous solution is prevented by the numerous ions in the main bulk of an aqueous solution that setup a counter field that acts to cancel any applied field. Most all of the voltage potential drop occurs across the first few Debye lengths from the electrode interface into the aqueous solution. Pulsed DC fields have conventionally been used in birefringence and dichroism experiments to work around this effect. Pulses can propagate further into an aqueous solution before the ions in the bulk can react. Unfortunately, millisecond pulses do not allow sufficient time for the induced protein dipoles to nucleate into a crystal.

In FIG. 1, the small working volume of the protein solution 20 equates to the electric double layer at an electrode-fluid interface, e.g., the Helmholtz-Stern layer. This transition region hosts molecules that transition between fixed, confined, and fluid motions. The width of this layer is sub-micron in size and the field strengths can easily be on the order of 100 MV/m.

There are two advantages to very small working volumes. Electrochemistry teaches that the Helmholtz-Stern layer is sub-micron in width and that there is a threshold voltage that must be reached before a current will be sustained, e.g., an avalanche current similar to that of a Zener diode. This corresponds to an ionization potential for pulling an electron out of the carrier fluid. It is related to the Nernst potential and is on the order of one volt, which is an easy voltage to generate and a safe voltage to work with. It is preferable in aqueous protein solution embodiments of the present invention not to exceed the decomposition voltage (1.23 V) of water, because any voltage leads to redox effects and currents through the solution. Such currents are also not accounted for in equation (5).

The sub-micro-volumes in embodiments of the present invention are such that the electric fields are not uniform throughout the Helmholtz-Stem layer. Such thin layers can restrict the height of any electrocrystals of proteins in the z-axis of the third dimension to a relatively small number of planes. It is preferable to allow epitaxial growth at least a thousand planes of crystal layers for x-ray diffraction scattering analysis.

Various edge-effects can appear in embodiments of the present invention because the electrodes used are not infinite parallel planes. The electric field lines of a capacitor, or charged lipid bilayer, will typically concentrate on the inside and bulge out with a lower density around the perimeter.

Alternative embodiments of the present invention all include methods or growing diffraction quality protein crystals on demand, based on the self-assembly of induced dipoles. The resultant protein crystals may exist at room temperature only as long as there is an applied voltage. Alternatively, the resultant protein crystals may be stored in a cryogenic state without an applied voltage. The resultant protein crystals are screened by conventional x-ray diffraction techniques to determine the conformational structures of the proteins.

The field strengths used preferably do not denature globular proteins. If necessary, the electrostatic stresses in the overall shape of the globular protein can be reduced or removed subsequent to x-ray crystallography by turning the applied field down or off, e.g., in a molecular dynamics simulation.

Figure 2:
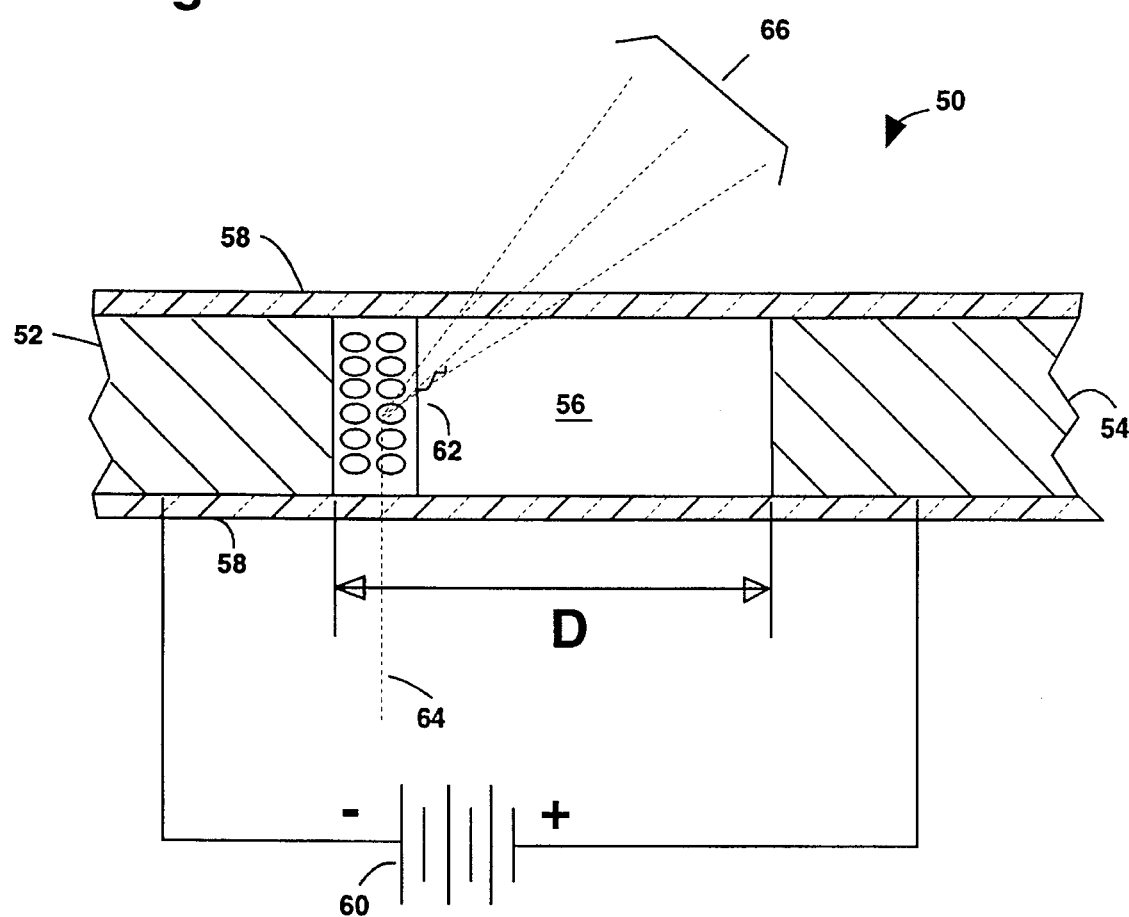
FIG. 2 is a diagram of an alternative system embodiment of the present invention for determining the conformational structure of proteins by x-ray crystallography.

FIG. 2 is an alternative system 50 for determining the conformational structure of proteins. A pair of electrodes 52 and 54 are separated by a gap D, e.g., about one centimeter. An aqueous protein solution 56 is contained between the electrodes by a plastic film 58, e.g., MYLAR. A voltage source 60 applied to the electrodes causes a protein crystal 62 to form. An x-ray 64 is focused at the crystal 62 and a diffraction pattern 66 results that can be detected and interpreted using conventional x-ray crystallography techniques.

Although particular embodiments of the present invention have been described and illustrated, such is not intended to limit the invention. Modifications and changes will no doubt become apparent to those skilled in the art, and it is intended that the invention only be limited by the scope of the appended claims.

The invention claimed is:

1. A method for determining the conformational structure of a protein sample, the method comprising the steps of:

applying an electrical voltage between two electrodes that interface with a liquid and protein macromolecule mixture;

maintaining said electrical voltage to promote formation of said protein macromolecules into pearl chains and synthesized three-dimensional protein crystals; and screening said synthesized three-dimensional protein crystals by x-ray crystallography to determine the conformational structure of said basic protein.

2. The method of claim 1, wherein:

the step of applying further comprises preventing an electrical current flow through said liquid and protein macromolecule mixture between said electrodes.

3. The method of claim 1, wherein:

the step of applying further comprises a dielectric coating on said electrodes for preventing an electrical current flow through said liquid and protein macromolecule mixture between said electrodes.

4. The method of claim 1, wherein:

the step of applying further comprises an orthogonal magnetic field for preventing an electrical current flow through said liquid and protein macromolecule mixture disposed between said electrodes.

5. The method of claim 1, wherein:

the step of applying includes establishing an electric field strength between said electrodes in the range of three megavolts per meter to three gigavolts per meter and a parallel separation of said electrodes that does not exceed one micrometer.

6. The method of claim 1, wherein:

the protein macromolecules are no smaller than one nanometer and no larger than one micrometer.

7. The method of claim 1, wherein:

the step of applying further comprises a liquid and a protein macromolecule mixture that have substantially different dielectric constants.

8. The method of claim 1, wherein:

the applying of the electric voltage is such that said mixture includes a substantial dielectric mismatch between the dielectric constant of the protein macromolecules and said liquid, and provides for the induction of a dipole moment.

9. A method for protein crystallography, the method comprising the steps of:

diagnosing electric fields in a double layer of an electrode-fluid interface using electrochemistry techniques;

seeding this layer with polymer macromolecules and demonstrating that a complex fluid at the interface solidifies under the action of the electric field;

using electron microscopy to examine a registry of the macromolecules;

repeating the steps of seeding and using electron microscopy with a globular protein;

using x-ray scattering to see if the diffraction pattern of the globular proteins can be deconvolved to Angstrom resolution by computational modeling; and comparing the resulting conformation with a preexisting protein database.

10. A method for creating diffraction-quality protein crystals on a microchip suitable for x-ray and electron diffraction studies, the method comprising the steps of:

suspending a plurality of protein macromolecules each with a dipole moment in a liquid solution that in turn is disposed within a micron-sized gap between two micro-electrodes on a silicon substrate;

applying a voltage across said two micro-electrodes such that said protein macromolecules are aligned by the effects of an electric field in the electric double layer on permanent and induced dipole moments; and electromechanical erecting at least one two-dimensional seed matrix providing for a subsequent self-assembly of at least one three-dimensional protein crystal.

* * * * *